United States Patent
Downes, Jr. et al.

[11] Patent Number: 5,940,729
[45] Date of Patent: Aug. 17, 1999

[54] METHOD OF PLANARIZING A CURVED SUBSTRATE AND RESULTING STRUCTURE

[75] Inventors: Francis Joseph Downes, Jr., Vestal; Stephen Joseph Fuerniss, Endicott, both of N.Y.; Gary Ray Hill, Jericho, Vt.; Anthony Paul Ingraham, Endicott; Voya Rista Markovich, Endwell, both of N.Y.; Jaynal Abedin Molla, Chandler, Ariz.

[73] Assignee: International Business Machines Corp., Armonk, N.J.

[21] Appl. No.: 08/633,984

[22] Filed: Apr. 17, 1996

[51] Int. Cl.⁶ .................................................. H01L 21/44
[52] U.S. Cl. ........................ 438/613; 438/631; 257/739; 257/773
[58] Field of Search ..................... 257/757, 739, 257/752, 773, 774, 778; 438/613, 631

[56] References Cited

U.S. PATENT DOCUMENTS

| | | |
|---|---|---|
| 4,548,451 | 10/1985 | Benarr et al. . |
| 4,612,210 | 9/1986 | Hofer et al. . |
| 4,622,058 | 11/1986 | Leary-Renick et al. . |
| 4,659,585 | 4/1987 | Elias et al. . |
| 4,761,332 | 8/1988 | Elias et al. . |
| 4,789,648 | 12/1988 | Chow et al. . |
| 4,879,156 | 11/1989 | Herron et al. . |
| 4,954,214 | 9/1990 | Ho . |
| 4,996,584 | 2/1991 | Young et al. . |
| 5,026,666 | 6/1991 | Hills et al. . |
| 5,137,461 | 8/1992 | Bindra et al. . |
| 5,137,597 | 8/1992 | Curry, II et al. . |
| 5,185,073 | 2/1993 | Bindra et al. . |
| 5,244,534 | 9/1993 | Yu et al. . |
| 5,250,472 | 10/1993 | Chen et al. ............................. 438/631 |
| 5,266,446 | 11/1993 | Chang et al. . |
| 5,287,619 | 2/1994 | Smith et al. . |
| 5,328,553 | 7/1994 | Poon . |
| 5,354,712 | 10/1994 | Ho et al. . |
| 5,366,850 | 11/1994 | Chen et al. ............................. 438/631 |
| 5,397,741 | 3/1995 | O'Connor et al. . |
| 5,487,949 | 1/1996 | Farnworth ............................. 438/613 |
| 5,585,282 | 12/1996 | Wood et al. ........................... 438/613 |
| 5,665,657 | 9/1997 | Lee ....................................... 438/631 |

OTHER PUBLICATIONS

"Postage Stamp Lamination of Reworkable Interposers for Direct Chip Attach," R.A. Foster, et al.; IBM Technical Disclosure Bulletin, vol. 36, No. 12; Dec., 1993.

"Gapless Planarized Structures for Integrated Electronic Packaging," Brady, et al.; IBM Technical Disclosure Bulletin, vol. 30, No. 8; Jan., 1988.

*Primary Examiner*—Kevin M. Picardat
*Attorney, Agent, or Firm*—William N. Hogg

[57] ABSTRACT

According to the present invention a technique for providing a planarized substrate with dendritic connections of solder balls, especially a multi-layer ceramic substrate is provided. In the case where the substrate has a raised central portion on the top surface on which are disposed top surface metallurgy pads, a layer of conformable photoimagable material is placed over the top surface.

The photoimagable material is exposed and developed in a pattern corresponding to the pattern of the top surface metallurgy pads to form vias in the photoimagable material. Copper is plated in the vias in contact with the top surface metallurgy pads. The exposed surface of the photoimagable surface is then planarized, preferably by mechanical polishing to form a flat planar surface, with the ends of the vias exposed. Dendritic connector pads are then grown on the exposed ends of the vias to which solder ball connections of an I/C chip are releasably connected.

24 Claims, 2 Drawing Sheets

METHOD OF PLANARIZING A CURVED SUBSTRATE AND RESULTING STRUCTURE

FIELD OF THE INVENTION

This invention relates generally to providing a planarized or flattened surface on a curved, rigid substrate, and more particularly to a technique for providing a flat planar surface on a curved ceramic substrate used to mount integrated circuit (I/C) chips.

BACKGROUND OF THE INVENTION

In the production of electronic equipment utilizing I/C chips and the testing and use of the I/C chips in electronic circuitry, one common technique is to mount the I/C chip onto a chip carrier by what is sometimes known as "flip-chip" mounting. In such a technique, a ceramic carrier is provided which may be a metalized chip carrier or a multi-layer ceramic chip carrier, with chip mounting pads formed on the surface. The carrier may be used for either permanently mounting the chips, i.e., mounting the chips for ultimate packaging by connecting the carrier to a circuit board, or it may be mounted temporarily or removably mounted for the purpose of testing the chips or for burn in of the chips where the chips are "burnt-in" or conditioned for use.

In the case of ceramic carriers and especially in the case of multi-layer ceramic carriers, the metalization, and especially the metalization between the various layers, fans out from a more dense configuration toward the center of the chip carrier to a less dense configuration toward the outer edges of the ceramic chip carrier. This tends to cause a bulging of the surface of the chip carrier on which the attachment pads are located, this outward bulging being in an essentially convex shape.

In one technique for chip attachment, dendrites are grown on the chip attachment pads on the ceramic substrate, and the chips have solder balls which contact the dendrites and form a releasable or removable connection of the chip to the chip carrier. This dendritic-type connection requires a relatively flat or planar surface, and the curved configuration or curvature of the substrate often prevents good solid connection between the solder balls on the chip and the dendrite connections grown on the pads on the chip carrier. While in some instances during the manufacturing process it may be possible to detect this curvature and take steps, such as grinding the ceramic, nevertheless this procedure is expensive, and the curvature is not always detected. Indeed, in certain rework conditions, the curvature may have gone undetected or, alternatively, the substrates may have been designed to be used with chips in such a way that the curvature had no detrimental effect. However, it is necessary in many instances to deal with the curvature condition on ceramic or other type chip carrier to provide an essentially planar surface on which the dendritic connections are grown and to which the solder balls are connected for testing burn-in or, even in some instances, a connection for a chip in its operating mode.

SUMMARY OF THE INVENTION

According to the present invention, a method of manufacturing a chip carrier substrate for the removable reception of an I/C chip thereon is provided. This particular invention is useful when the substrate has a top surface having a plurality of top surface metallurgy (TSM) pads thereon, and wherein the top surface has a curvelinear configuration. This is especially the case encountered in multi-layer ceramic (MLC) substrates which act as chip carriers. A compliant, photoimagable material, such as a photoimagable polyimide or a solder mask material, is applied to the top surface of the ceramic as a sheet of material. The sheet of material is photoimaged and developed in a pattern to provide a plurality of vias corresponding the TSM pads, such vias extending from the exposed surface of the photoimagable material to the TSM pads. Conducting materials are disposed in the vias and extend from contact with the top surface metallurgy (TSM) pads out to the exposed surface of the photoimagable material. The photoimagable material with the vias and the conducting material therein are planarized, preferably by mechanical polishing to provide an essentially flat planar surface in the region where the vias are located. Dendritic connection pads are grown on the top of each of the vias, preferably a palladium dendrite. I/C chips having solder balls thereon are then removably connected to the dendritic connection pads by pressing solder balls on the chip firmly against the pads, resulting in the dendrites embedding in the solder ball material, causing a removable connection therebetween. Because of the planar surface of the photoimagable material and tops of the conducting material in the vias, the dendritic connection pads are in an essentially planar configuration, which then conforms with the planar configuration of the solder balls on the chip to provide good connections to all of the solder balls, and thus good connections to the entire I/C circuit chip. This connection can then be used either as a connection for testing a chip or providing the burn-in function for the chip, or, in some instances, may constitute the operating connection of the chip that is used for electronic circuits.

DESCRIPTION OF THE PREFERRED EMBODIMENT

Figure 1:
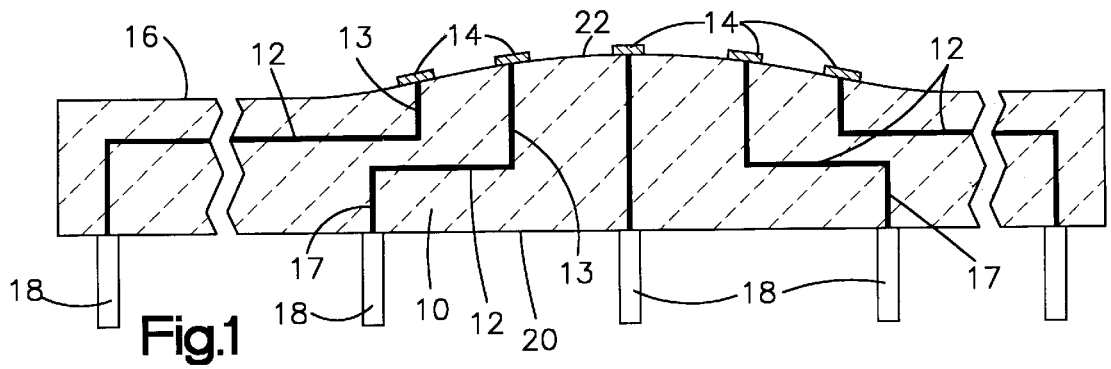
FIG. 1 is a longitudinal, sectional view of a typical MLC substrate with an I/C chip carrier.
Figure 2:
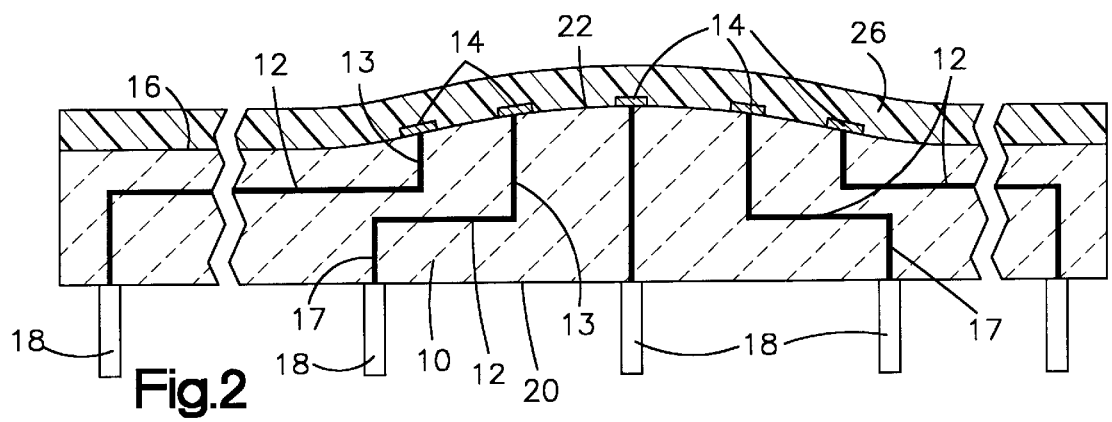
FIG. 2 is a longitudinal, sectional view showing the application of a conformal photoimagable coating tie substrate.

Referring now the drawings and for the present to FIG. 1, a longitudinal, sectional view, somewhat schematic, of a multi-layer ceramic (MLC) chip carrier is shown. The chip carrier includes a substrate 10, which is comprised of a plurality of layers of ceramic material which have been laid up and fired, with internal wiring 12 formed therein in a conventional manner. Metal-filled vias 13 connect with the internal wiring 12 and terminate in TSM pads 14 on top surface 16 of the substrate 10. Vias 17 also connect with internal wiring 12 and pins 18 on bottom surface 20 of the substrate 10. The pins 18 provide for attachment of the chip carrier to a circuit board or card. Of course, other types of attachments, such as solder ball or other technology, can be used in place of the pins for connecting of the chip carrier to a circuit board or card as is well known in the art.

As can be seen in FIG. 1, the top surface 16 of the substrate 10 has a curvelinear shape which includes a convexly curved central portion 22. The curvature is somewhat exaggerated in the drawings for the purpose of illustration, the amount of curvature usually being no more than about 2 mils. Although the reason for this curvature is not completely understood, it is believed that a contributing significant factor is that the internal wiring 12 converges toward the center of the substrate 10, thus being more dense there; and hence the forming operation of the substrate from the multiple layers causes this curvature. However, for whatever reason the curvature does exist.

The bottom surface 20 is shown as being essentially flat, although in some instances it may also have a curvature, also believed to be due to the same reasons. However, whatever curvature may exist on the bottom is not a significant detriment as is the curved central portion 22 on the top surface 16. (As used herein the terms "top surface" and "bottom surface" refer only to their orientation as depicted in the drawing, it being understood that the orientation of the chip carrier in use can be with these surfaces in any direction.) The curvature on the top surface 16 is detrimental to the attachment of an I/C chip to the TSM pads if dendritic plating is used for such attachment. This is because when dendritic plating takes place, the material plates uniformly up from the top of the surface, and the resulting dendritic-plated TSM pads will be in a curvelinear pattern just as is the central portion 20 of the top surface 16. Since the I/C chip is essentially flat and the solder balls on the I/C chip used to attach to the dendrites are of substantially planar configuration, the center of the chip would make good contact with those dendrites in the center, but those solder balls around the outer edge of the chip would have a greater chance of not forming good contact. Pressure to form such contact could cause the chip to bend and therefore could cause either breakage or other malfunctions in the chip. Therefore, the object is to provide an essentially flat planar surface for the dendritic plane so that the dendritic plating will provide a relatively flat planar array of dendrites for the reception of the TSM on the I/C chip.

To this end, a conformal coating of photoimagable material 26 is applied over the top surface 16 of the ceramic substrate 10. Preferably, this photoimagable material is a sheet of material; and a material well-suited for such purpose is Ultradel which is a photoimagable polyimide sold by Amoco Chemical Company of Naperville, Ill. Other materials, such as dry film solder mask material, e.g., a photoimagable epoxy can also be used, such solder mask materials being well known. The thickness of the material 26 is preferably from about 2–6 mils, and more preferably from about 2–3 mils.

Figure 3:
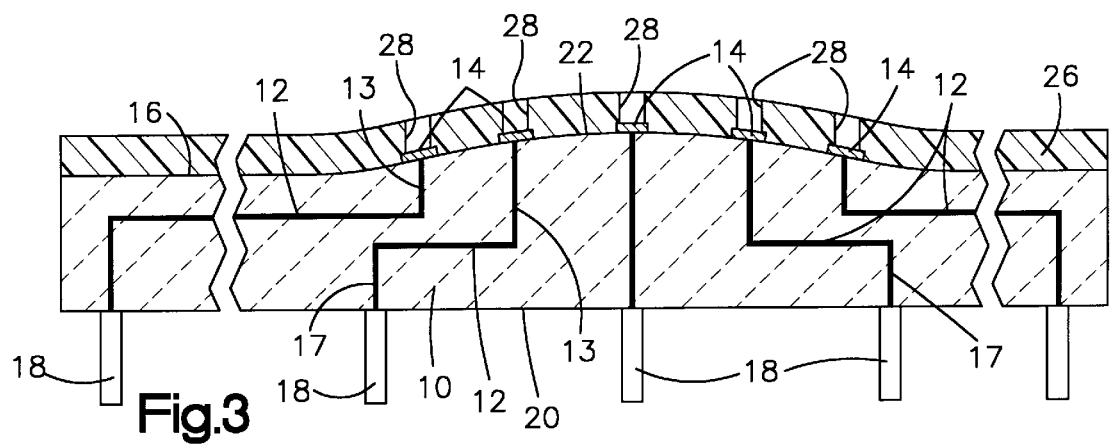
FIG. 3 shows a view similar to FIG. 2 of the vias in the photoimagable material which have been formed by photoimaging and developing.

The photoimagable material is exposed through a mask and developed to form openings or vias 28 therein which correspond in location and arrangement to the location and arrangement of the pads 14 of the top surface metallurgy. Typically, the diameter of the pads 14 is about 6 mils, and it is desired to form the vias with diameters slightly smaller than this, preferably in the range of 2–5 mils and more preferably in the range of 3–4 mils. This is shown in FIG. 3.

Figure 4:
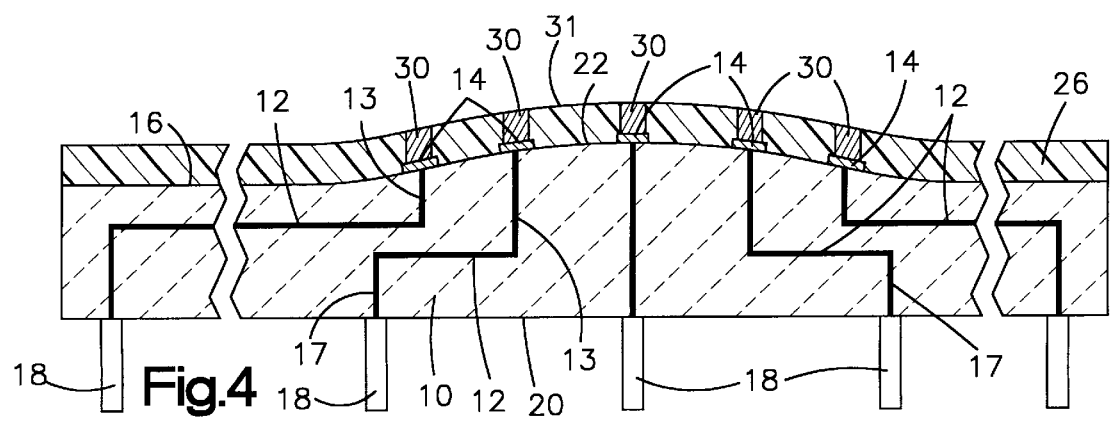
FIG. 4 is a view similar to FIG. 3 showing copper plated into the vias.
Figure 5:
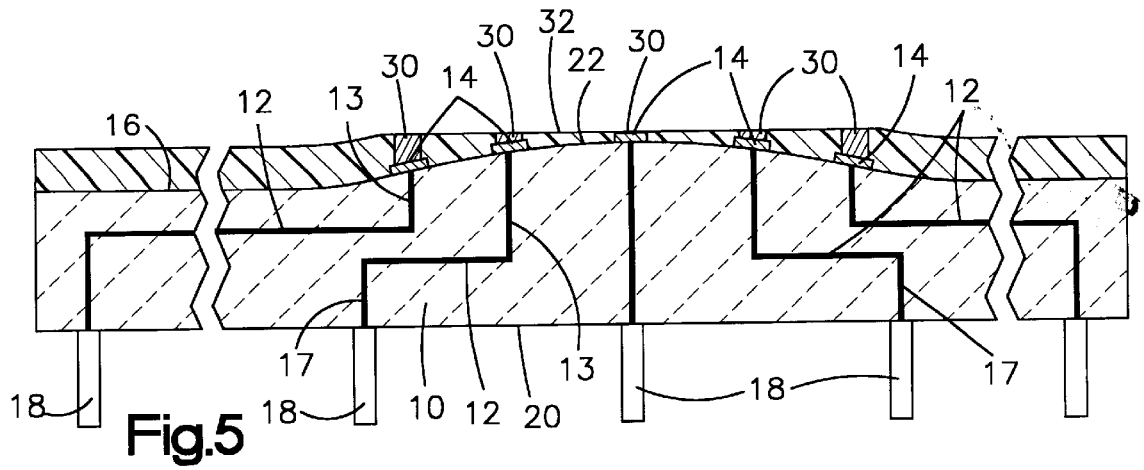
FIG. 5 is a view similar to FIG. 4 showing the planarized surface of the conformal coating.

The next step, shown in FIG. 4, is to fill the vias or openings 28 with a conducting material 30. This is done preferably by electroplating or electroless plating copper up from the pads 14. Since the pads 14 provide the base for starting the plating, no seed layer is necessary, and the plating is done until the copper fills the vias as shown in FIG. 4. At this point, the top surface 31 of the photopatternable material 26 is planarized in the region where the vias 28 are located. To this end, a polishing operation is performed which can be a mechanical polishing in which a slurry of an abrasive, such as a slurry of either alumina or diamond dust, is used as a purely mechanical polishing operation to provide the flat planarized surface 32 as shown in FIG. 5. A chemical mechanical polishing could be performed if desired and if preferred results are not obtained by mechanical polishing, however mechanical polishing is normally acceptable and therefore is the preferred technique.

Figure 6:
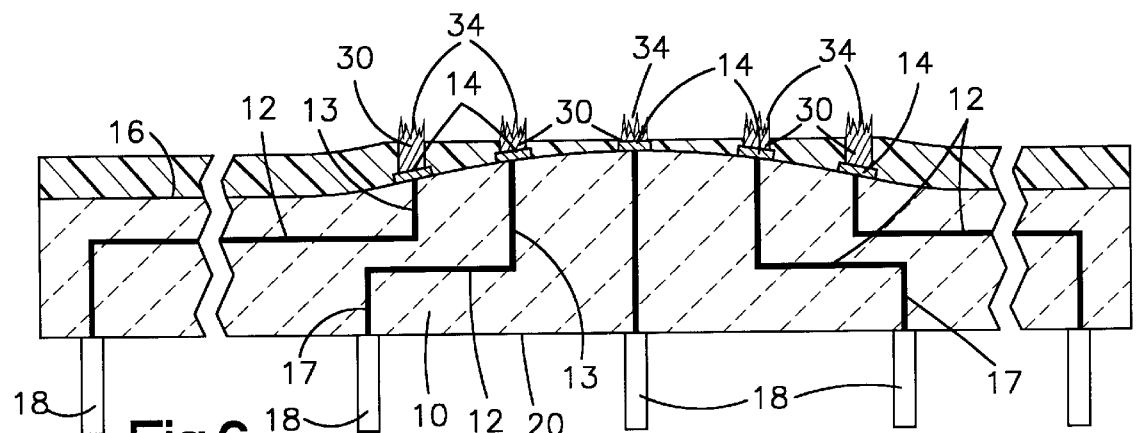
FIG. 6 is a view similar to FIG. 5 showing dendrites grown on the exposed copper in the via for reception of an I/C chip.

Following the planarization of the top surface 32, dendrites 34 are grown on the exposed end of the conducting material 30 to provide solder ball connections to releasably secure I/C chips as will be described presently. Dendritic plating is well known in the art; a particularly useful technique is described in U.S. Pat. No. 5,185,073 and No. 5,137,461. Preferably, the material for the dendrites is palladium, although other materials can be used, such as platinum, rhodium, iridium, ruthenium, osmium, tungsten and copper. These materials are intended to be illustrative only and not limiting. The dendrites are plated as shown in FIG. 6.

Figure 7:
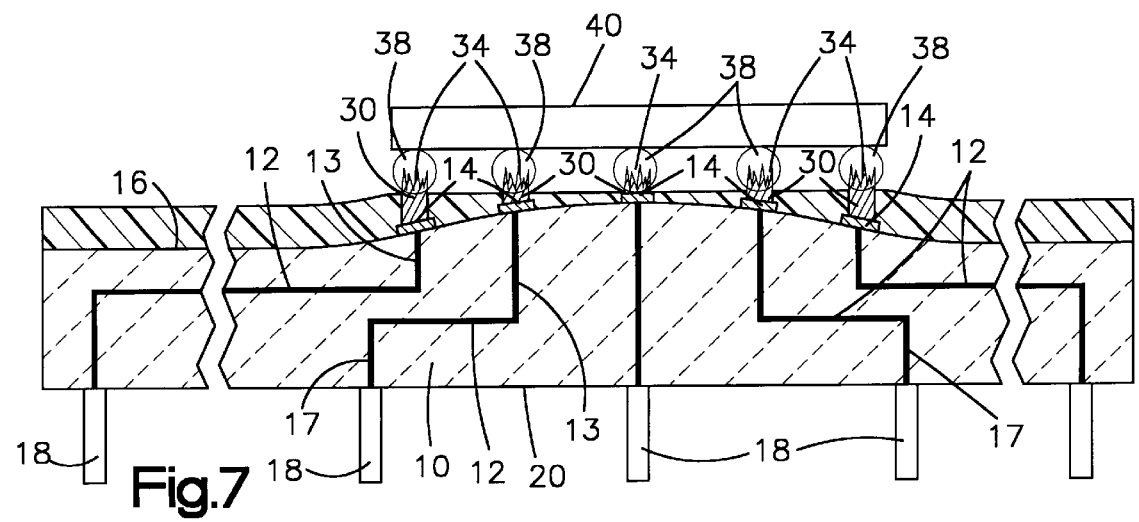
FIG. 7 is a view similar to FIG. 6 showing the attachment of an I/C chip by solder ball technology to the dendritic pads.

Solder balls 38 forming a pattern on I/C chip 40 corresponding to the pattern of the dendrites 34 are pressed into the dendrite connections 34 as shown in FIG. 7 to form a releasable or separable connection between the I/C chip 40 and the ceramic substrate 10. This connection can be for the purpose of testing a chip or chip burn-in, after which the chip may be removed therefrom and more permanently attached to another substrate, such as by solder connections, for use in a production mode. However, in some instances the removable connection can itself serve as a connection used in a production chip, although typically in such case some type of reinforcement such as an encapsulant material would be used to reinforce this connection.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of manufacturing a substrate for the removable reception of an integrated circuit (I/C) chip thereon, comprising the steps of:

providing a substrate having a top surface with a plurality of top surface metallurgy (TSM) pads therein, and wherein said top surface has a curvelinear configuration, applying to the top surface of said substrate a compliant photoimagable material having an exposed surface thereon, photoimaging and developing said photoimagable material to provide a plurality of vias corresponding to the TSM pads and extending from the exposed surface to said underlying TSM pads, depositing conducting material in said vias in contact with said TSM pads, and extending at least to the exposed surface of said photoimagable material, planarizing said exposed surface and said conducting material in said vias to an essentially flat planar configuration in the region of said vias, and providing releasable electrical connections on said conducting material in said vias projecting from said planarized exposed surface of said photoimagable material.

2. The method as defined in claim 1 wherein said compliant photoimagable material is a solid sheet of material.

3. The method as defined in claim 1 wherein said planarization is performed by mechanical polishing.

4. The method as defined in claim 1 wherein each of said vias has a circumferential area less than the area of each of said TSM pads.

5. The method as defined in claim 1 wherein the conducting material deposited in said vias is copper.

6. The method as defined in claim 1 wherein said releasable electrical contacts are grown dendritic connection.

7. The method as defined in claim 6 wherein said dendritic connectors are palladium dendrites.

8. The method as defined in claim 1 wherein said photoimagable material is a sheet of material.

9. The method as defined in claim 8 wherein said photoimagable material is a polyimide.

10. The method as defined in claim 8 wherein said photoimagable material is an epoxy.

11. The method as defined in claim 1 wherein said top surface curved structure is generally convex.

12. The method as defined in claim 1 wherein said substrate is a multi-layer ceramic chip carrier.

13. The method as defined in claim 1 further characterized by securing an I/C chip to said releasable electrical connections by means of solder ball connections.

14. A chip carrier for releasably mounting an I/C chip comprising:

a substrate having a top surface with a plurality of TSM pads thereon, said top surface having a curvelinear configuration, a compliant photoimagable material disposed on top of said top surface and having an exposed surface thereon, a plurality of vias corresponding in location to said TSM pads, conducting material in said vias extending from said TSM pads to said exposed surface, said exposed surface of said photopatternable material and the conducting material on said exposed surface being essentially a flat planar surface in the area of said conducting material, and a releasable electrical connection contacting said conducting materials in said vias and extending from said flat planar surface of said photoimagable material to releasably secure I/C chips thereto.

15. The structure as defined in claim 14 wherein said compliant photopatternable material is a solid sheet of material.

16. The structure as defined in claim 15 wherein the photoimagable material is a polyimide.

17. The structure as defined in claim 15 wherein the photoimagable material is an epoxy.

18. The structure as defined in claim 14 wherein each of said vias has a circumferential area within the area of each of said TSM pads.

19. The structure as defined in claim 14 wherein the conducting material in said vias is copper.

20. The structure as defined in claim 14 wherein the releasable electrical contacts are dendritic connections.

21. The structure as defined in claim 20 wherein said dendritic connections are palladium.

22. The structure as defined in claim 14 wherein said top surface of the curved structure is generally concave.

23. The structure as defined in claim 14 wherein said substrate is a multi-layer ceramic chip carrier.

24. The structure as defined in claim 14 further characterized by an I/C chip secured to said releasable electrical connections.

* * * * *